(12) United States Patent
Yang et al.

(10) Patent No.: US 11,350,545 B2
(45) Date of Patent: May 31, 2022

(54) COLD PLATE ASSEMBLY FOR AN ELECTRONIC COMPONENT

(71) Applicant: GE AVIATION SYSTEMS LLC, Grand Rapids, MI (US)

(72) Inventors: Liqiang Yang, Pompano Beach, FL (US); Richard Anthony Eddins, Margate, FL (US); Darrell Lee Grimes, Boca Raton, FL (US); Michel Engelhardt, Woodbury, NY (US)

(73) Assignee: GE Aviation Systems LLC, Grand Rapids, MI (US)

( * ) Notice: Subject to any disclaimer, the term of this patent is extended or adjusted under 35 U.S.C. 154(b) by 0 days.

(21) Appl. No.: 16/704,522

(22) Filed: Dec. 5, 2019

(65) Prior Publication Data
US 2021/0176896 A1   Jun. 10, 2021

(51) Int. Cl.
*H05K 7/20*   (2006.01)
*B64D 47/00*   (2006.01)

(52) U.S. Cl.
CPC ..... *H05K 7/20636* (2013.01); *H05K 7/20254* (2013.01); *B64D 47/00* (2013.01)

(58) Field of Classification Search
CPC ........... H05K 7/20636; H05K 7/20254; H05K 7/20927; H01L 23/473
See application file for complete search history.

(56) References Cited

U.S. PATENT DOCUMENTS

| 6,829,145 | B1 | 12/2004 | Corrado et al. |
| 9,401,317 | B2 | 7/2016 | Tan et al. |
| 9,445,526 | B2 * | 9/2016 | Zhou .................... H01L 23/4735 |
| 9,736,963 | B2 | 8/2017 | Pons et al. |
| 10,306,801 | B2 | 5/2019 | Chainer et al. |
| 2002/0162673 | A1 * | 11/2002 | Cook .................... H05K 9/0083 174/391 |
| 2005/0211427 | A1 * | 9/2005 | Kenny ...................... F28F 3/12 165/299 |
| 2010/0175857 | A1 | 7/2010 | Gerstler et al. |
| 2012/0325447 | A1 * | 12/2012 | You ...................... H01M 10/625 165/170 |
| 2015/0007969 | A1 | 1/2015 | Pal |
| 2017/0055378 | A1 | 2/2017 | Zhou et al. |
| 2018/0284852 | A1 | 10/2018 | Rannow et al. |
| 2019/0090343 | A1 | 3/2019 | Mische |
| 2019/0300180 | A1 * | 10/2019 | Yang ...................... B64D 43/00 |

FOREIGN PATENT DOCUMENTS

| CN | 204598551 U | 8/2015 |
| CN | 108759533 A | 11/2018 |
| DE | 102009012042 A1 | 9/2010 |
| JP | 2014082283 A | 5/2014 |
| JP | 2014158055 A | 8/2014 |
| JP | 2015233094 A | 12/2015 |

* cited by examiner

*Primary Examiner* — Mukundbhai G Patel
(74) *Attorney, Agent, or Firm* — McGarry Bair PC

(57) ABSTRACT

An apparatus and method relating to a cooling adapter having a housing with at least one mounting aperture and including at least one cooling manifold comprising an inlet plenum having at least one inlet for entry of a cooling fluid, an outlet plenum having at least one outlet for exhausting the cooling fluid, and a plurality of channels disposed between the inlet channel and the outlet channel for allowing the cooling fluid to move therebetween.

23 Claims, 8 Drawing Sheets

COLD PLATE ASSEMBLY FOR AN ELECTRONIC COMPONENT

TECHNICAL FIELD

This disclosure relates to a method and apparatus for a cold plate assembly for cooling an electronic component, specifically a cold plate assembly having a base with a cooling manifold and an adapter.

BACKGROUND

Power electronics refers to the application of solid-state electronics related to the control and conversion of electrical power. This conversion is typically performed by silicon, silicon carbide, and gallium nitride as well as other semiconductor devices that are packaged into power modules. One of the factors associated with power modules is the generation of heat due to electrical power conversion inefficiency. While the heat generated by the power modules is due to many factors, it generally relates an efficiency loss, typically generated as heat. Increased temperatures can result in a reduction in the reliability of the power module performance.

An additional factor for thermal management relates to the packaging of several devices in small form factors. The power density, at which the devices, and thus the module can reliably operate; therefore, depends on the ability to remove this generated heat. The common form of thermal management of power electronics is through heat sinks. Heat sinks operate by transferring the heat away from the heat source of the power module, thereby maintaining the heat source at a lower relative temperature. There are various types of heat sinks known in the thermal management field including air-cooled and liquid-cooled devices as well as phase change devices to ride out transient heat dissipations.

One example of the thermal management of a power module includes the attachment of a heat sink with embedded passages (tubes) to provide liquid cooling of the power module. The heat sink is typically a metallic structure, such as aluminum or copper. A cooling medium is passed through the tubes to cool the power module. The heat sink is typically coupled to the power module base with a thermal interface material (TIM) dispersed there between. The thermal interface material may comprise thermal greases, compliant thermal pads, phase change materials, or the like.

BRIEF DESCRIPTION

In one aspect, the present disclosure relates to a cold plate assembly for an electronic component comprising a polymer base; a cooling manifold comprising a coolant passage within the polymer base and having an inlet and an outlet; a first cooling interface located in the polymer base and fluidly coupled to the coolant passage; at least one metal adapter having a second cooling interface mating with the first cooling interface and configured to mount the electronic component.

In another aspect, the present disclosure relates to a method of forming a cold plate for an electronic component, the method comprising manufacturing a polymer base with a cooling manifold having an inlet and an outlet extending between a coolant passage and with a first cooling interface fluidly coupled to the coolant passage; manufacturing at least one metal adapter having a second cooling interface configured to mount the electronic component; and mating the second cooling interface with the first cooling interface.

DETAILED DESCRIPTION

Figure 1:
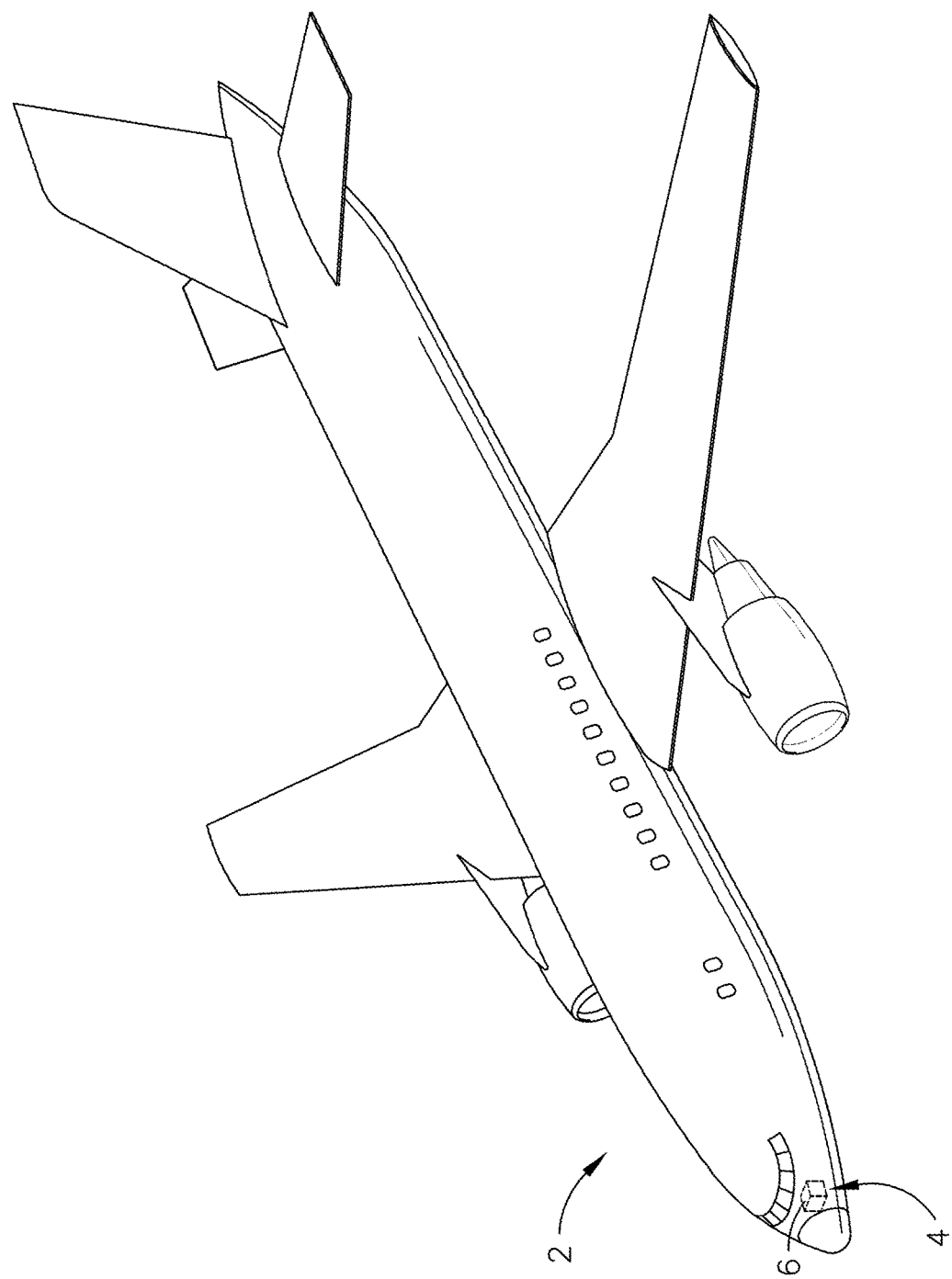
FIG. 1 is a perspective view of an aircraft having an electronics chassis including an avionics system in accordance with various aspects described herein.

Aspects of the disclosure described herein are directed to a cold plate assembly for an electronic component where the cold plate assembly has multiple components including a polymer base. For purposes of illustration, the present disclosure will be described with respect to a cold plate assembly for cooling a power module. It will be understood, however, that aspects of the disclosure described herein are not so limited and may have general applicability within the field of electronics.

All directional references (e.g., radial, axial, proximal, distal, upper, lower, upward, downward, left, right, lateral, front, back, top, bottom, above, below, vertical, horizontal, clockwise, counterclockwise, upstream, downstream, forward, aft, etc.) are only used for identification purposes to aid the reader's understanding of the present disclosure, and do not create limitations, particularly as to the position, orientation, or use of aspects of the disclosure described herein. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to one another. The exemplary drawings are for purposes of illustration only and the relative dimensions, positions, order and relative sizes reflected in the drawings attached hereto can vary. As used herein, the term "set" or a "set" of elements can be any number of elements, including only one.

FIG. 1 schematically illustrates an aircraft 2 with an avionics system 4, illustrated as an on-board electronics chassis 6 (shown in phantom) for housing avionics or avionic components for use in the operation of the aircraft 2. It will be understood that the avionics system 4 can include a thermal management member having heat spreaders, heat sinks, heat exchangers, radiators, or heat pipes in non-limiting examples. The electronics chassis 6 can house a variety of power modules for avionics electronic components and protects against contaminants, electromagnetic interference (EMI), radio frequency interference (RFI), vibrations, shock and the like. Alternatively, or additionally, the electronics chassis 6 can have a variety of avionics mounted thereon. It will be understood that the electronics chassis 6 can be located anywhere within the aircraft 2, not just the nose as illustrated.

While illustrated in a commercial airliner, the electronics chassis 6 can be used in any type of aircraft, for example, without limitation, fixed-wing, rotating-wing, rocket, commercial aircraft, personal aircraft, and military aircraft. Furthermore, aspects of the disclosure are not limited only to aircraft aspects, and can be included in other mobile and stationary configurations. Non-limiting example mobile configurations can include ground-based, water-based, or additional air-based vehicles.

Figure 2:
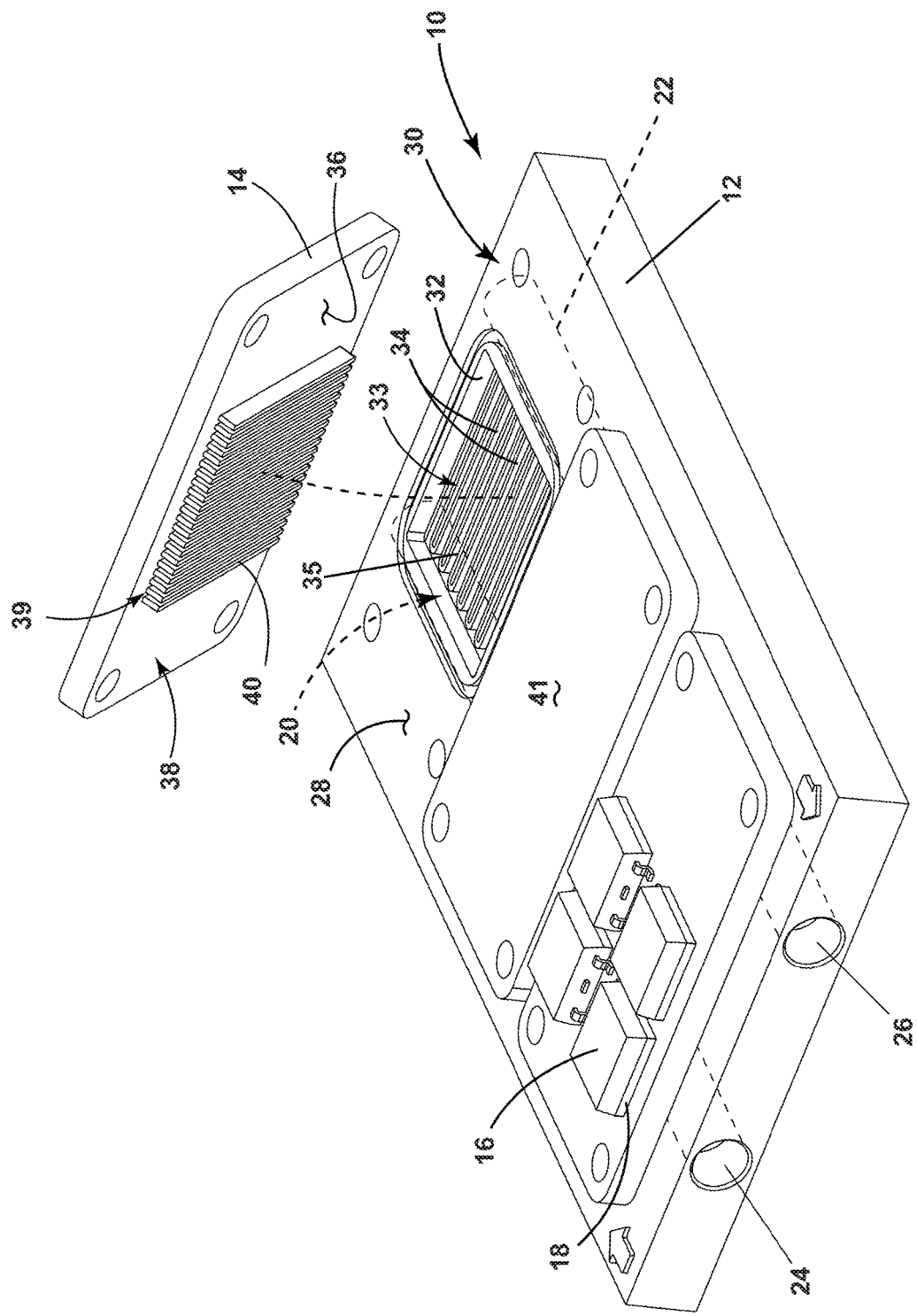
FIG. 2 is a perspective view of a cold plate assembly with an electronic component that can be located within the electronics chassis of FIG. 1 according to an aspect of the disclosure herein.

FIG. 2 is a cold plate assembly 10 including a base plate formed from a polymer and herein referred to as a polymer base 12, and at least one heat sink, or metal adapter 14, illustrated as three metal adapters. An electronic component 16 and a substrate 18 can be mounted to the metal adapter 14. It should be understood that more or less metal adapters 14 can be part of the cold plate assembly 10 and more or less electronic components can be mounted to the metal adapter 14.

In an aspect of the disclosure herein the electronic component 16 is standardized such as a commercial off the shelf (COTS) part so that the shape, holes, and features of the electronic component 16 are matched to the metal adapter 14. Non-limiting examples of the electronic component 16 can include insulated gate bipolar Transistors (IGBT), metal oxide semiconductor field effect transistors (MOSFET), diodes, metal semiconductor field effect transistors (MESFET), and high electron mobility transistors (HEMT) used for applications not limited to avionics applications, automotive and sea applications, oil and gas applications, medical, or the like. According to aspects of the disclosure herein, the electronic component 16 can be manufactured from a variety of semiconductors, non-limiting examples of which include as example silicon, silicon carbide, gallium nitride, or gallium arsenide. The electronic component 16 can generate steady-state or transient heat loads during operation. The cold plate assembly 10 is mounted to a polymer base 12. The cold plate assembly 10 can be located in the electronics chassis 6 (FIG. 1).

The substrate 18 can be provided to avoid electrical short circuits and to perform heat exchange between the metal adapter 14 and the electronic component 16. The substrate 18 can be an electrically isolating and thermally conductive layer, such as a ceramic layer. Non-limiting examples of the ceramic layer can include aluminum oxide, aluminum nitride, beryllium oxide, and silicon nitride. In one non-limiting example, the metal adapter 14 can be directly bonded to the substrate 18. The substrate 18 can be coupled to the metal adapter 14 and the electronic component 16 using a number of techniques, including but not limited to, brazing, diffusion bonding, soldering, pressure contact such as clamping to provide a simple assembly process, or bonding with a thin layer of thermal interface material (TIM). The TIM optimizes the contact interface between solid components by increasing conduction heat transfer between the components and reducing the effect of thermal expansion between the components with dissimilar coefficient of thermal expansion It should be noted herein that the exemplary arrangement described with respect to FIG. 2 is for illustrative purposes only and not meant to be limiting.

The polymer base 12 can be formed to include at least one mounting aperture 37 to enable the metal adapter 14 to be affixed to polymer base 12 at corresponding metal adapter holes 43, by way of non-limiting example with bolts 45. The manner in which the metal adapter 14 coupled to the polymer base 12 enables direct cooling to the metal adapter 14 from cooling fluid within the polymer base 12. Contact between the metal adapter 14 and the polymer base 12 can improve thermal dissipation of the cold plate assembly 10.

The polymer base 12 can be additively manufactured. An additive manufacturing (AM) process is where a component is built layer-by-layer by successive deposition of material. AM is an appropriate name to describe the technologies that build 3D objects by adding layer-upon-layer of material, whether the material is metal or non-metal. AM technologies can utilize a computer, 3D modeling software (Computer Aided Design or CAD), machine equipment, and layering material. Once a CAD sketch is produced, the AM equipment can read in data from the CAD file and lay down or add successive layers of liquid, powder, sheet material or other material, in a layer-upon-layer fashion to fabricate a 3D object. It should be understood that the term "additive manufacturing" encompasses many technologies including subsets like 3D Printing, Rapid Prototyping (RP), Direct Digital Manufacturing (DDM), layered manufacturing and additive fabrication. Non-limiting examples of additive manufacturing that can be utilized to form an additively-manufactured component include powder bed fusion, vat photopolymerization, binder jetting, material extrusion, directed energy deposition, material jetting, electric pulses through a laser induced plasma channel, or sheet lamination. Other manufacturing techniques can be considered such as molding. In addition, after forming the cold plate, the polymer base 12 can be plated with a base metal such as nickel or another metal. The metallic plating can form a leak proof polymer base 12. It should be understood that various types of plating methods can be utilized to plate the polymer base 12.

A cooling manifold 20 having a coolant passage 22, illustrated in phantom, can be provided within the polymer base 12 and includes an inlet 24 and an outlet 26. An upper surface 28 can define a first cooling interface 30 of the polymer base 12. The first cooling interface 30 can be is fluidly coupled to the coolant passage 22, by way of non-limiting example, via at least one recess 32, illustrated as multiple recesses 32, within the upper surface 28. A first structure 33, by way of non-limiting example a plurality of channels 34 can be formed in the at least one recess 32. The plurality of channels 34 can be formed from a set of walls 35, arranged in any desired pattern, such as a zig-zag pattern as illustrated. The at least one recess 32 can further include a periphery groove 29 in which an elastomeric seal 31 can be received. By way of non-limiting example the elastomeric seal 31 can be a gasket or O-ring.

A lower surface 36 of the metal adapter 14 faces the polymer base 12 when assembled. The lower surface 36 can define a second cooling interface 38 for mating with the first cooling interface 30. A second structure 39 can be formed on the second cooling interface 38. By way of non-limiting example, the second structure is a set of fins 40 extending from the lower surface 36 and defining at least a portion of the second cooling interface 38. When assembled, the second structure 39 can be received within the at least one recess 32. Together, the first and second structures 33, 39, illustrated as the plurality of channels 34 and the set of fins 40, can form interconnected channels 42, which can be microchannels. An upper surface 41 of the metal adapter 14 can be flat and smooth.

Figure 3:
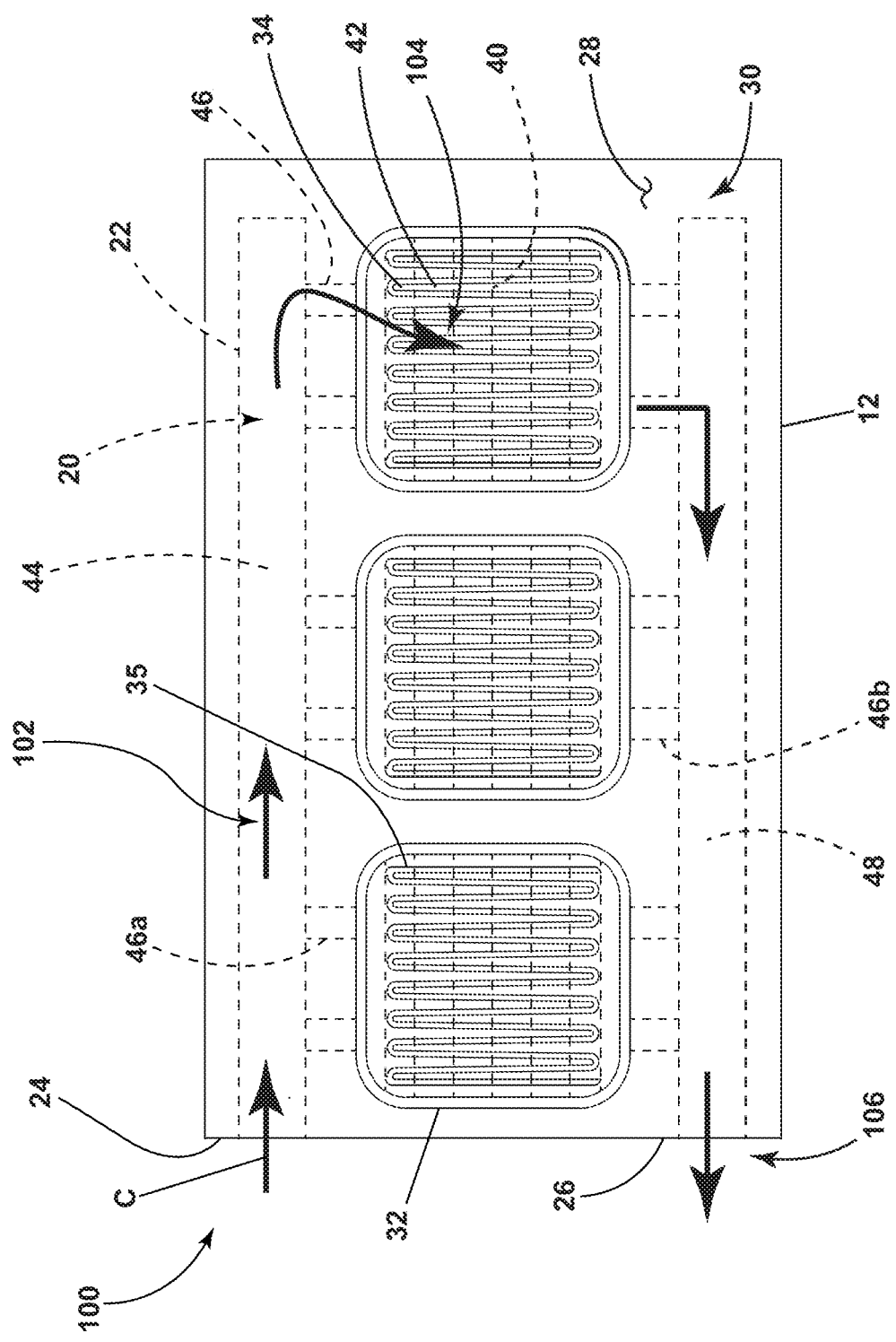
FIG. 3 is a schematic top view of the cold plate assembly of FIG. 2 illustrating a method of cooling the cold plate assembly.

Turning to FIG. 3, a schematic top view of the polymer base 12 more clearly illustrates the interconnected channels 42 formed. The set of walls 35 cross and the set of fins 40 (illustrated in phantom) can be oriented orthogonally with respect to each other. While illustrated in this manner, it should be understood that the set of walls 35 and the set of fins 40 can intersect each other at any angle.

The coolant passage 22 can include an inlet plenum 44 fluidly coupling the inlet 24 to the at least one recess 32 via at least one connecting channel 46, more specifically an inlet connecting channel 46a. The coolant passage 22 can further include an outlet plenum 48 fluidly coupling the outlet 26 to at least one recess 32 via an additional connecting channel 46, more specifically an outlet connecting channel 46b. While illustrated as generally orthogonally oriented with respect to each other, it should be understood that the inlet plenum 44 and the outlet plenum 44 can be fluidly coupled via the connecting channels 46a, 46b at any orientation.

In an aspect of the disclosure herein, a cooling fluid (C) flows through the plurality of channels 34 to cool the cold plate assembly 10. The cooling fluid (C) can be any suitable cooling fluid, by way of non-limiting example a mixture of propylene glycol and water. Preferably, the cooling fluid (C) can include 60 percent by weight of propylene glycol and 40 percent by weight of water. The cooling fluid (C) can also include other electrically conductive or non-electrically conductive liquids. It is further contemplated that the cooling fluid (C) can include a gaseous medium or a phase change (liquid-to-vapor or viscous-solid-to-liquid). Accordingly, when the electronic component 16 and the metal adapter 14 are disposed on the polymer base 12, the cooling fluid (C) flowing through the cooling manifold 20 of the polymer base 12 provides cooling to the electronic component 16.

A method 100 for cooling the cold plate assembly 10 can include introducing a cooling fluid flow at 102, by way of non-limiting example the cooling fluid (C) as described herein, through the at least one inlet 24 of the polymer base 12. At 104 flowing the cooling fluid (C) through the cooling manifold 20 and at 104 distributing the cooling fluid flow (C) between the polymer base 12 and the metal adapter 14. Distribution of the cooling fluid flow (C) between the polymer base 12 and the metal adapter 14 can occur as the cooling fluid flow (C) flows through the interconnected channels 42 formed by the plurality of channels 34 and the set of fins 40. The method further includes at 106 exhausting the cooling fluid flow (C) from the at least one outlet 26. It should be understood that the cooling fluid flow (C) that is exhausted from the at least one outlet 26 is relatively hotter than the cooling fluid flow (C) that was introduced to the at least one inlet 24 due to a heat exchange between the metal adapter 14 and the polymer base 12. The cold plate assembly 10 is therefore cooled. The method can further include distributing the cooling fluid (C) to the plurality of channels 34 via the inlet connecting channels 46a and draining the cooling fluid (C) via the outlet connecting channels 46b.

Figure 4:
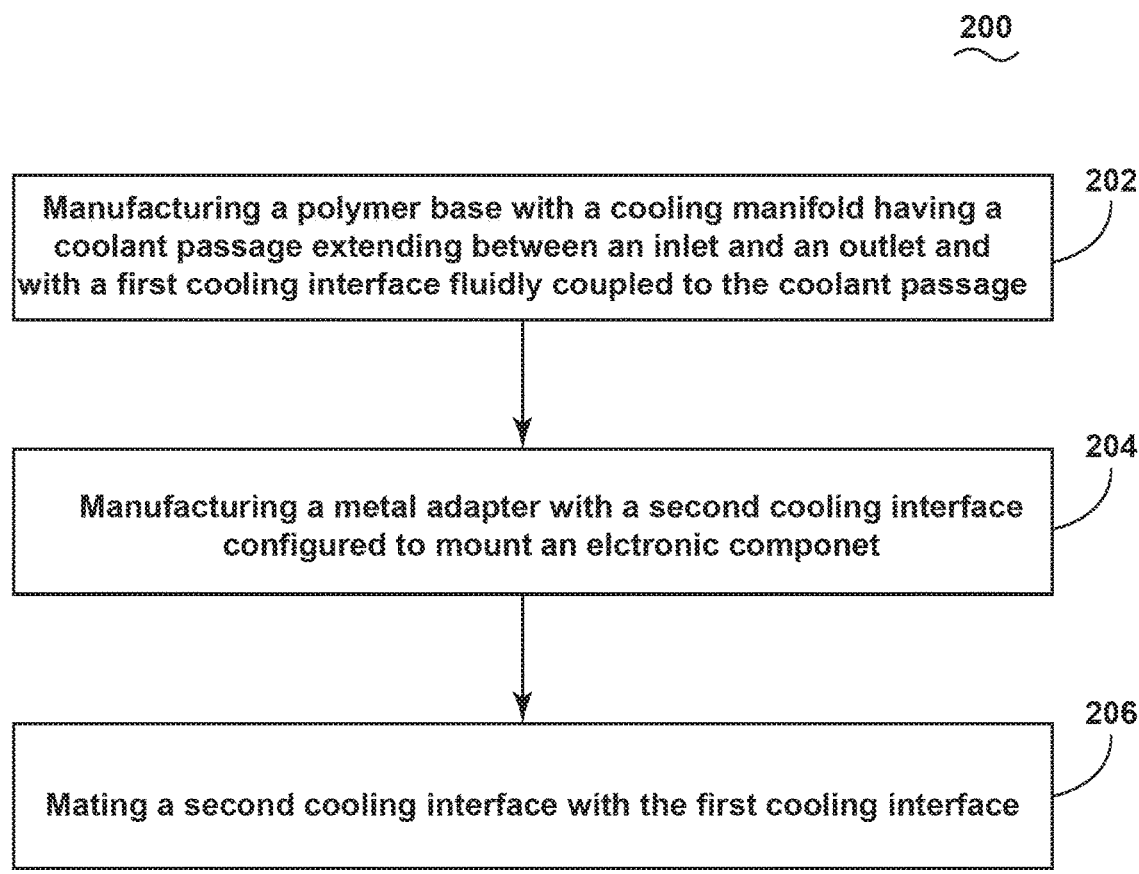
FIG. 4 is a flow chart for a method of forming the cold plate assembly of FIG. 2.

FIG. 4 is a flow chart illustrating a method 200 of forming the cold plate assembly 10 including at 202 manufacturing the polymer base 12 with the cooling manifold 20 having an inlet 24 and an outlet 26 extending between the coolant passage 22 and with the first cooling interface 30. At 204 manufacturing the metal adapter 14 with the second cooling interface 38 configured to mount the electronic component 16. At 206 mating the second cooling interface 38 with the first cooling interface 30. The cooling manifold 20 can be designed to minimize pressure drop due to hydraulic loses related to inlet, outlet, and bend as well as frictional losses and hydraulic diameter considerations.

Additionally, the method 200 can include forming the at least one recess 32 and forming a set of walls 35 within the at least one recess 32 to form the plurality of channels 34. By way of non-limiting example, the set of walls 35 can be formed in a zig-zag pattern. Also, forming the set of fins 40 to extend from the second cooling interface 38 and be received in the at least one recess 32 to form the interconnected channels 42. The metal adapter 14 can be formed with a smooth and flat upper surface 41. When assembled, the elastomeric seal can prevent leaking from the cooling manifold 20 between the upper surface 28 and the lower surface 36. It is further contemplated that the method 200 can include plating the cold plate assembly 10 as described herein to further mitigate leaking. The polymer base 12 of the cold plate assembly 10 can be plated with a metal such as nickel to avoid cold plate leakage vis-à-vis the porous nature of additive manufacturing.

Figure 5:
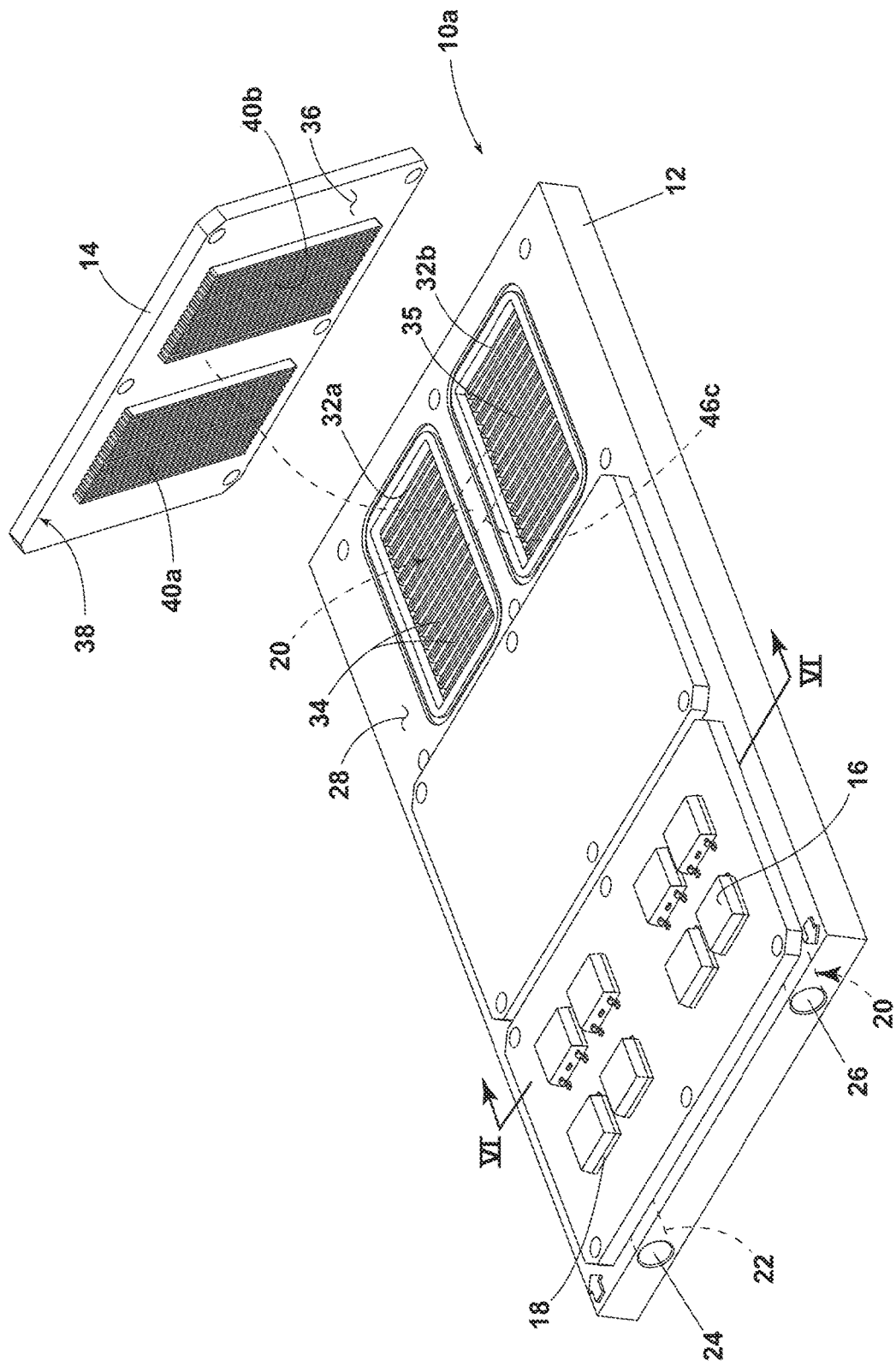
FIG. 5 is a perspective view of a variation of the cold plate assembly of FIG. 2 according to another aspect of the disclosure herein.

FIG. 5 is a cold plate assembly 10a similar to cold plate assembly 10 in both form and function as described herein. Cold plate assembly 10a includes multiple pairs of recesses 32a, 32b formed in a polymer base 12a, and at least one heat sink, or metal adapter 14a, illustrated as three metal adapters each having a pair of sets of fins 40a, 40b extending from the lower surface 36 of the metal adapter 14a. The pair of sets of fins 40a, 40b face the polymer base 12a when assembled. When assembled the pair of sets of fins 40a, 40b can be received within the corresponding pair of recesses 32a, 32b. While one pair of recesses 32a, 32b and one pair of sets of fins 40a, 40b are illustrated. It should be understood that two additional pairs are located in the exemplary cold plate assembly 10a beneath the additional metal adapters 14a illustrated.

It should be understood that the method 100 as described herein can further include cooling via the pair of recesses 32a, 32b and the pair of sets of fins 40a, 40b. It is therefore contemplated that an intermediate connecting channel 46c can fluidly couple the pair of recesses 32a, 32b enabling the cooling fluid (C) as described herein to flow between the plurality of channels 34 formed in the corresponding recesses 32a, 32b.

Furthermore, the method 200 can include forming the multiple recesses 32a, 32b and the multiple sets of fins 40a, 40b as illustrated in FIG. 5.

Figure 6:
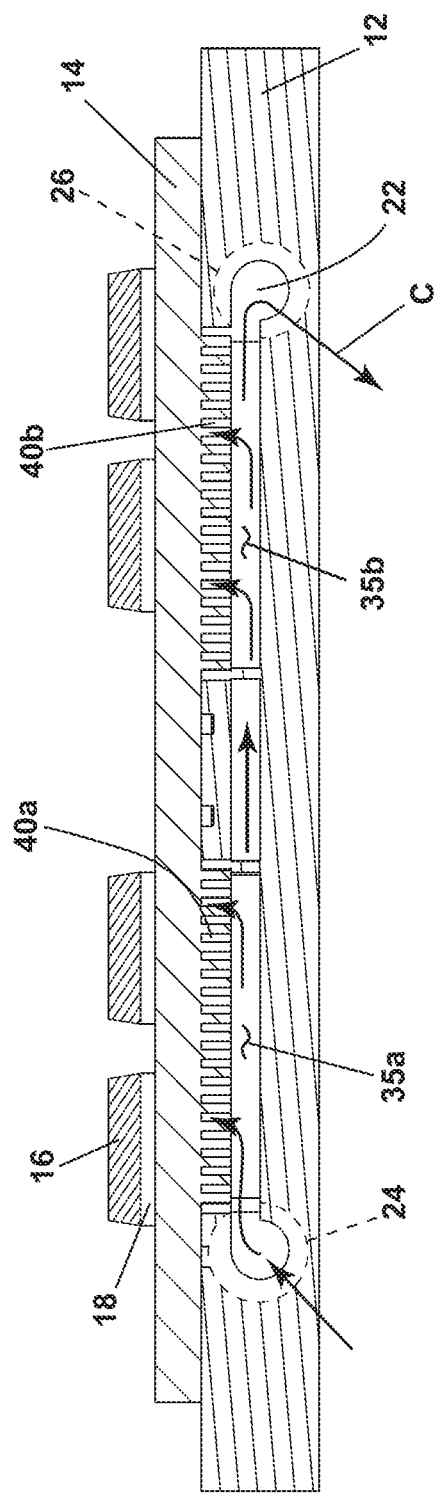
FIG. 6 is a cross-sectional view of the cold plate assembly of FIG. 5.

FIG. 6 is a cross-section taken along line VI-VI of FIG. 5 to more clearly illustrate the arrangement of the polymer base 12a and metal adapter 14a when assembled. It should be understood that a cross-sectional view of the cold plate assembly 10 would be similar. The cooling fluid flow (C) can flow along the set of walls 35 and is distributed into the pair of set of fins 40a, 40b cooling the metal adapter 14. It can also more clearly be seen that the cooling fluid flow (C) flows between the pair of recesses 32a, 32b via the intermediate connecting channel 46c.

Figure 7:
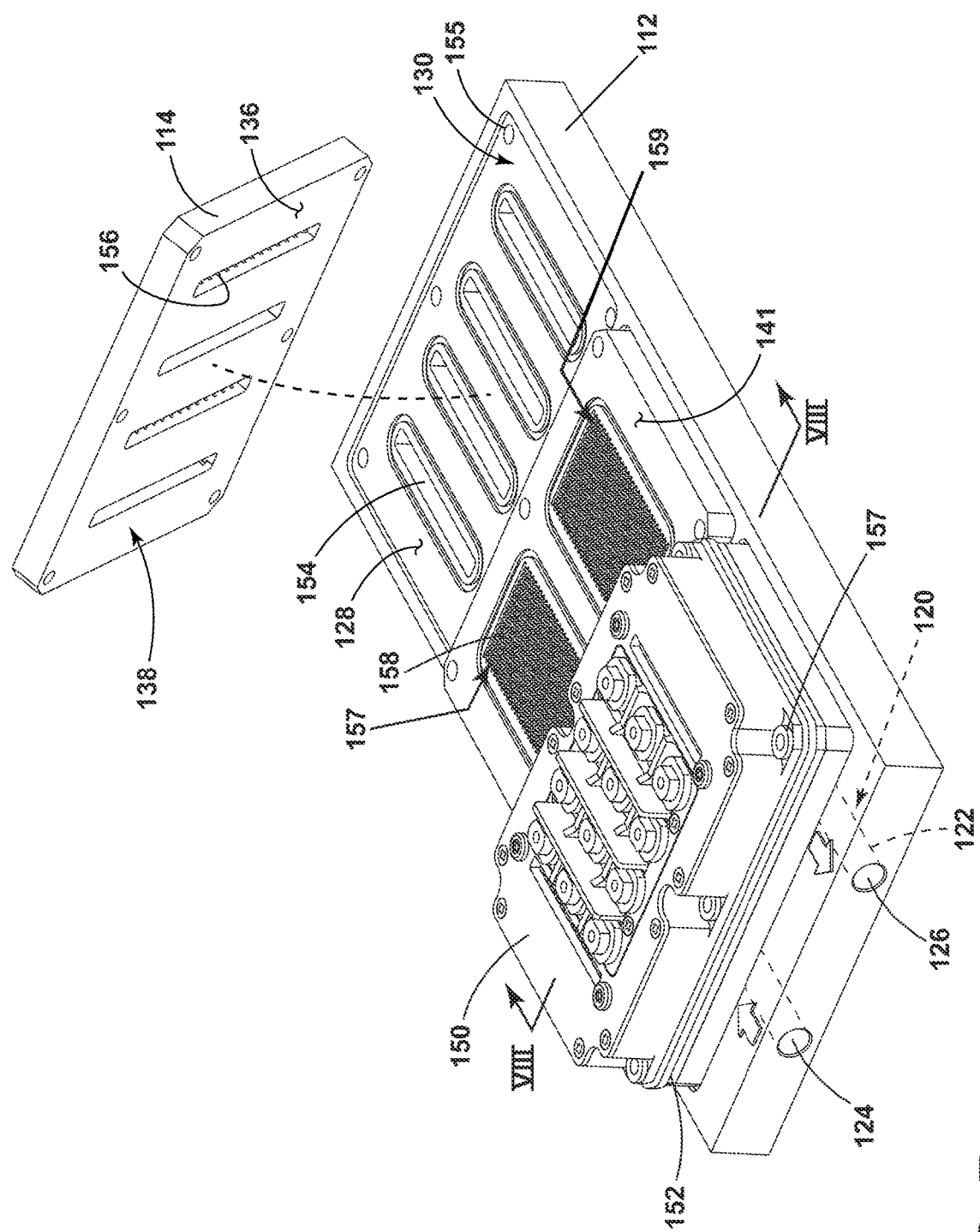
FIG. 7 is a perspective view of a cold plate assembly with a power module that can be located within the electronics chassis of FIG. 1 according to another aspect of the disclosure herein.

Turning to FIG. 7, another cold plate assembly 110 is illustrated. The cold plate assembly 110 is similar to the cold plate assembly 10, therefore, like parts will be identified with like numerals increased by 100, with it being understood that the description of the like parts of the cold plate assembly 10 applies to the cold plate assembly 110, unless otherwise noted.

The cold plate assembly 110 includes a polymer base 112 and a metal adapter 114, illustrated as three metal adapters. A power module 150 including a power module baseplate 152 can be mounted to the metal adapter 114. The baseplate 152 can be made of a metal or metal matrix composite (MMC). The MMC can include but is not limited to aluminum, copper, aluminum-SiC, aluminum-graphite. The baseplate 152 can have a matched coefficient of thermal expansion with electronic component that results in a reliable thermal stress over thermal cycle. The polymer base 112 can be additively manufactured.

A cooling manifold 120 having a coolant passage 122, illustrated in phantom, can be provided within the polymer base 112 and includes an inlet 124 and an outlet 126. An upper surface 128 can define a first cooling interface 130 of the polymer base 112. The first cooling interface 130 can be fluidly coupled to the coolant passage 122, by way of non-limiting example, via a set of base slots 154 formed within the polymer base 112 and fluidly coupled to the coolant passage 122. While illustrated as four base slots, it should be understood that more or less base slots can be part of the set of base slots 154 including only one. A lip 155 is formed in the upper surface 128 of the polymer base 112 for receiving the metal adapter 114. The lip 155 can prevent the metal adapter 114 from moving or sliding during assembly. Fasteners, by way of non-limiting example bolts 145, can hold the power module to the metal adapter 114 and the polymer base 112.

The metal adapter 114 can extend between a lower surface 136 facing the polymer base 112 and an upper surface 141. The lower surface 136 can define a second cooling interface 138 for mating with the first cooling interface 130. A set of adapter slots 156 can be formed on the second cooling interface 138 and extend at least partially through toward the upper surface 141 of the metal adapter 114. The set of adapter slots 156 aligns with the set of base slots 154 when assembled. An interconnected set of microchannels 158 can be formed in the upper surface 141 of the metal adapter 114 and be fluidly coupled to the set of adapter slots 156. The interconnected set of microchannels 158 can be formed as a pair of interconnected sets of microchannels 158 as illustrated. While illustrated as a pair of interconnected sets of microchannels 158, it should be understood that more or less interconnected sets of microchannels can be part of the interconnected set of microchannels 158 including only one.

The interconnected set of microchannels 158 can include a set of orthogonal channels 157, with varying depths. By way of non-limiting example, the sets of orthogonal channels 157 can have a maximum depth on one side of the metal adapter 114 and as the set of orthogonal channels 157 approaches another side of the metal adapter the depth decreases. It is contemplated that the sets of orthogonal channels 157 are fluidly connected to the set of adapter slots 156. It is contemplated that the set of orthogonal channels 157 are alternating sets such that every other channel is fluidly coupled to a different adapter slot 156.

A set of parallel channels 159 can intersect with the set of orthogonal channels 157 to form the interconnected set of microchannels 158. In aspects of the disclosure herein, the interconnected set of microchannels 158 can have a rectangular or square cross-section. Non-limiting examples of the cross-sectional area shape of the interconnected set of microchannels 158 can include circular, triangular, trapezoidal, and u-shaped cross-sections. The interconnected set of microchannels 158 can be cast, machined, 3D printed, or etched, and can be smooth or rough in the cooling adapter 18. Roughened channels can have a relatively large surface area to enhance turbulence of the cooling fluid so as to augment thermal transfer therein. In non-limiting examples, the interconnected set of microchannels 158 can include features such as dimples, bumps, or the like to increase the roughness thereof. Furthermore, the geometry of the adapter slots 156 and the interconnected set of microchannels 158 can be designed based on the application, type of cooling medium used, and the ambient temperature. The number of channels can vary depending on the application.

The interconnected set of microchannels 158 as described herein are given a more complete exemplary description with regards to geometry in US20190300180 filed Mar. 30, 2018 referred to therein as a plurality of channels in a manifold plane, application US20190300180 is therefore incorporated herein by reference.

The method 200 as described herein can further include forming the set of base slots 154 within the polymer base 112 to fluidly couple the metal adapter 114 to the coolant passage 122. The set of adapter slots 156 can be formed on the second cooling interface 138 and extend at least partially through the at least one metal adapter 114. The interconnected set of microchannels 158 can be formed in the upper surface 141 of the metal adapter 114 to be fluidly coupled to the set of adapter slots 156 to form a cooling fluid passageway 160 (FIG. 8) between the set of base slots 154 and the metal adapter 114.

Figure 8:
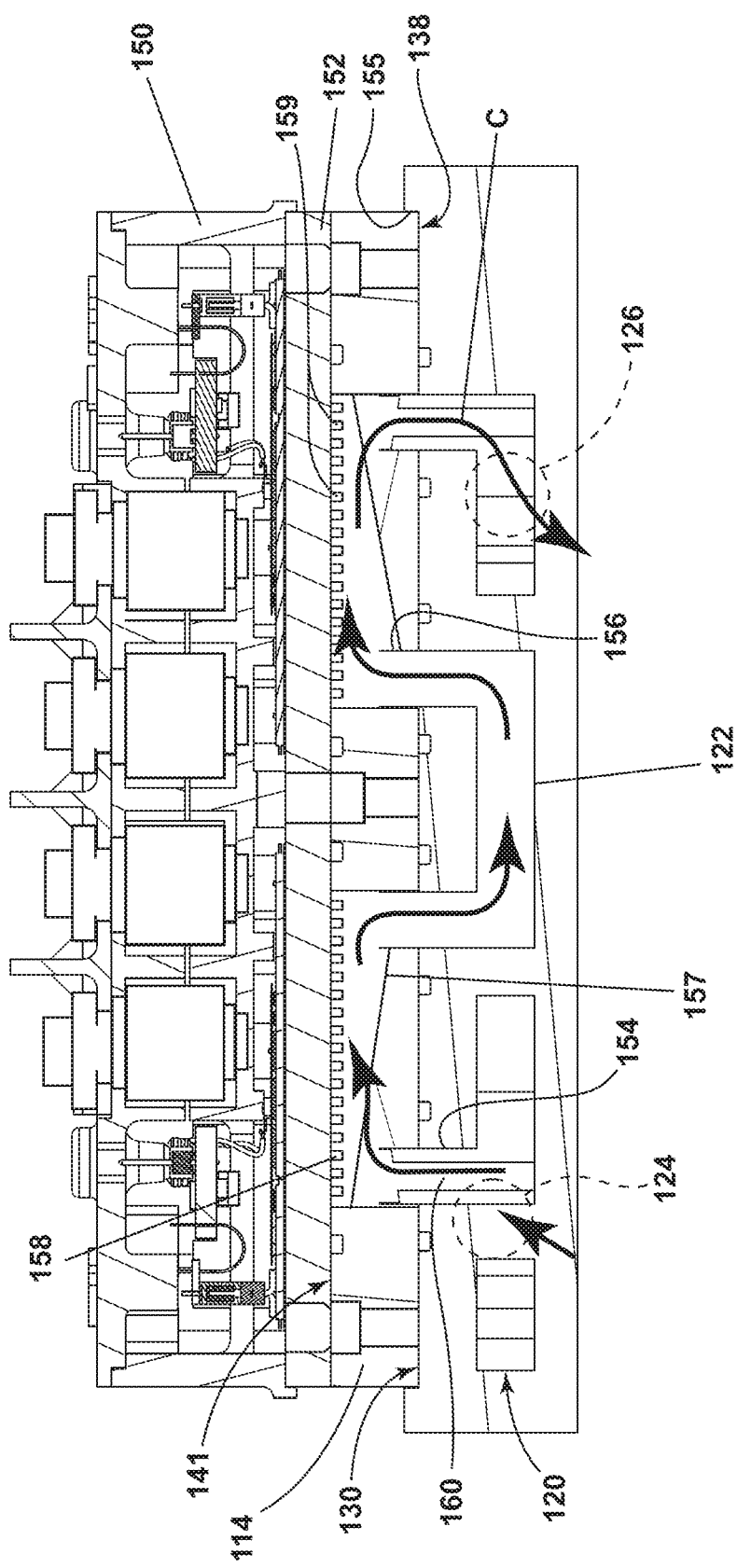
FIG. 8 is a cross-sectional view of the cold plate assembly of FIG. 7.

Turning to FIG. 8 a cross-section taken along line VIII-VIII of FIG. 7 more clearly illustrates the arrangement of the polymer base 112 and metal adapter 114 when assembled. Additionally, the variation of depth as the set of orthogonal channels 157 extends between sequential adapter slots 156 is more clearly evident. A cooling fluid passageway 160 is formed between the coolant passage 122 and the metal adapter 114 when the set of base slots 154 aligns with the set of adapter slots 156. The method 100 as described herein can include flowing the cooling fluid flow (C) through the cooling fluid passageway 160. The method 100 can further include redistributing the cooling fluid flow (C) among the interconnected set of microchannels 158. As is illustrated, the cooling fluid flow (C) can flow between the polymer base 112 and the metal adapter 114 via the cooling fluid passageways 160 multiple times, first from the polymer base 112 to the metal adapter 114 and then from the metal adapter 114 to the polymer base 112 and then back into the metal adapter 114 before finally returning to the polymer base 112 and exhausting via the outlet 126.

The method 200 can further include forming the set of base slots 154 within the polymer base 112 to fluidly couple the metal adapter 114 to the coolant passage 122. The set of adapter slots 156 can be formed on the second cooling interface that extend at least partially through the at least one metal adapter. The interconnected set of microchannels 158 can be formed in the upper surface 141 of the metal adapter 114 to be fluidly coupled to the set of adapter slots 156. It is further contemplated that the lip 155 is formed in the upper surface 128 of the polymer base 112 for receiving the metal adapter 114.

Utilizing the cold plate as described herein provides cost savings when compared to machined cold plates. Unlike cold plates manufactured completely from metal components, the cold plate as described herein is a hybrid cold plate that effectively balances material capability with cost and functionality. Short lead times are required for additively manufacturing polymer base which also enables a lighter weight cold plate. In avionics weight decrease is advantageous for fuel efficiency Another benefit associated with the polymer base and metal adapter as described herein is the interchangeability of the polymer base and metal adapter with existing cold plates. In this respect, the cooling adapter can be used to replace portions of a cold plate without having to replace an entire power module. This provides an added cost benefit.

This written description uses examples to describe aspects of the disclosure described herein, including the best mode, and also to enable any person skilled in the art to practice aspects of the disclosure, including making and using any devices or systems and performing any incorporated methods. The patentable scope of aspects of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

Further aspects of the invention are provided by the subject matter of the following clauses:

1. A cold plate assembly for an electronic component comprising a polymer base; a cooling manifold comprising a coolant passage within the polymer base and having an inlet and an outlet; a first cooling interface located in the polymer base and fluidly coupled to the coolant passage; at least one metal adapter having a second cooling interface mating with the first cooling interface and configured to mount the electronic component.

2. The cold plate assembly of claim 1, wherein the first cooling interface further comprises at least one recess.

3. The cold plate assembly of claim 2, further comprising a first structure formed in the at least one recess.

4. The cold plate assembly of claim 3, further comprising a second structure formed on the second cooling interface and received within the at least one recess.

5. The cold plate assembly of claim 4, further comprising a periphery groove around the at least one recess for receiving an elastomeric seal.

6. The cold plate assembly of claim 5, wherein the first and second structures together form channels.

7. The cold plate assembly of claim 6, wherein the first structure is a plurality of channels and the second structure is a set of fins extending from the second cooling interface.

8. The cold plate assembly of claim 7, wherein the at least one recess is multiple recesses formed in the first cooling interface and the set of fins is multiple sets of fins received in the corresponding multiple recesses.

9. The cold plate assembly of claim 1, wherein the at least one metal adapter extends between an upper surface and the second cooling interface.

10. The cold plate assembly of claim 9, wherein the upper surface is a flat surface.

11. The cold plate assembly of claim 9, further comprising a set of base slots formed within the polymer base and fluidly coupled to the coolant passage.

12. The cold plate assembly of claim 11, further comprising a set of adapter slots formed on the second cooling interface and extending at least partially through toward the upper surface of the at least one adapter.

13. The cold plate assembly of claim 12, wherein the set of base slots aligns with the set of adapter slots to form a cooling fluid passageway between the at least one channel and the at least one metal adapter.

14. The cold plate assembly of claim 13, further comprising an interconnected set of microchannels formed in the upper surface of the at least one metal adapter and fluidly coupled to the set of adapter slots.

15. A method of forming a cold plate assembly for an electronic component, the method comprising manufacturing a polymer base with a cooling manifold having an inlet and an outlet extending between a coolant passage and with a first cooling interface fluidly coupled to the coolant passage, manufacturing at least one metal adapter having a second cooling interface configured to mount the electronic component; and mating the second cooling interface with the first cooling interface.

16. The method of claim 15, further comprising forming at least one recess in the first cooling interface and a periphery groove surrounding the at least one recess.

17. The method of claim 16, further comprising forming a first structure in the at least one recess and a second structure on the second cooling interface of the at least one metal adapter to be received within the at least one recess, the first and second structures together forming channels.

18. The method of claim 17, further comprising sealing the first cooling interface with the second cooling interface by receiving an elastomeric seal in the periphery groove.

19. The method of claim 15, further comprising forming the at least one metal adapter with a smooth and flat upper surface.

20. The method of claim 15, further comprising forming a set of base slots within the polymer base that are fluidly coupled to the coolant passage.

21. The method of claim 20, further comprising forming a set of adapter slots on the second cooling interface that extend at least partially through the at least one metal adapter.

22. The method of claim 21, further comprising forming an interconnected set of microchannels in an upper surface of the at least one metal adapter that are fluidly coupled to the set of adapter slots to form a cooling fluid passageway between the at least one channel and the at least one metal adapter.

23. The method of claim 15, further comprising additively manufacturing the polymer base.

24. The method of claim 22, further comprising plating the polymer base with a metal to prevent fluid leakage under pressure.

What is claimed is:

1. A cold plate assembly for an electronic component comprising:
a polymer base formed as a first single unit, the first single unit comprising:
an upper surface defining a first cooling interface;
a cooling manifold comprising a coolant passage within the polymer base and having an inlet and an outlet; and
a first structure formed within the upper surface and fluidly coupled to the coolant passage; and
at least one metal adapter defining a second unit, the second unit comprising:
a lower surface facing the polymer base and defining a second cooling interface for mating with the first cooling interface, the lower surface comprising a set of adapter slots; and
an upper surface having at least one set of channels fluidly coupled to the set of adapter slots and to the first structure and configured to mount the electronic component;
wherein the at least one set of channels comprises an alternating set of channels where every other channel in the alternating set of channels is fluidly coupled to a different adapter slot in the set of adapter slots.

2. The cold plate assembly of claim 1, further comprising a periphery groove around the at least one set of channels for receiving an elastomeric seal.

3. The cold plate assembly of claim 1, wherein the first structure is a set of base slots.

4. The cold plate assembly of claim 3, further comprising the set of adapter slots formed on the second cooling interface and extending at least partially through toward the upper surface of the at least one metal adapter.

5. The cold plate assembly of claim 4, wherein the set of base slots aligns with the set of adapter slots to form a cooling fluid passageway between the set of base slots and the at least one metal adapter.

6. The cold plate assembly of claim 5, wherein the at least one set of channels is an interconnected set of microchannels formed in the upper surface of the at least one metal adapter and fluidly coupled to the set of adapter slots.

7. A method of forming a cold plate assembly for an electronic component, the method comprising:
   manufacturing a polymer base by forming a first single unit, the first single unit formed with a cooling manifold having an inlet and an outlet extending between a coolant passage, an upper surface defining a first cooling interface fluidly coupled to the coolant passage, and a first structure within the upper surface that is fluidly coupled to the coolant passage;
   manufacturing at least one metal adapter by forming a second unit, the second unit formed with a lower surface having a set of adapters slots facing the polymer base and defining a second cooling interface, an upper surface having at least one set of channels formed within, fluidly coupled to the set of adapter slots, and configured to mount the electronic component, and a second structure formed on the lower surface and fluidly connected to the at least one set of channels; and
   mating the second cooling interface with the first cooling interface;
   wherein the at least one set of channels comprises an alternating set of channels where every other channel in the alternating set of channels is fluidly coupled to a different adapter slot in the set of adapter slots.

8. The method of claim 7, further comprising forming at least one recess in the first cooling interface and a periphery groove surrounding the at least one recess.

9. The method of claim 8, further comprising sealing the first cooling interface with the second cooling interface by receiving an elastomeric seal in the periphery groove.

10. The method of claim 7, wherein manufacturing the first structure comprises forming a set of base slots within the polymer base that are fluidly coupled to the coolant passage.

11. The method of claim 10, wherein forming the second structure comprises forming a set of adapter slots that extend at least partially through the at least one metal adapter.

12. The method of claim 11, wherein forming the at least one set of channels comprises forming an interconnected set of microchannels in an upper surface that are fluidly coupled to the set of adapter slots to form a cooling fluid passageway between the at least one set of channels and the at least one metal adapter.

13. The method of claim 7, wherein manufacturing the polymer base comprises additively manufacturing the polymer base.

14. The method of claim 7, further comprising plating the polymer base with a metal to prevent fluid leakage under pressure.

15. The cold plate assembly of claim 1, wherein the polymer base is plated with nickel.

16. The cold plate assembly of claim 1, further comprising a set of adapter slots formed on the second cooling interface and extending at least partially through toward the upper surface of the at least one adapter to form a cooling fluid passageway between the at least one set of channels and the first structure.

17. The cold plate assembly of claim 16, wherein the first structure is a set of base slots.

18. A cold plate assembly for an electronic component comprising:
   an additively manufactured base formed as a first single unit comprising a first cooling interface with a set of base slots fluidly coupled to a cooling manifold disposed within;
   at least one metal adapter defining a second unit comprising a second cooling interface with a set of adapter slots; and
   a set of channels formed within an upper surface of the at least one metal adapter and fluidly connected to the set of adapter slots, the set of channels including a set of orthogonal channels and a set of parallel channels interconnected to define an interconnected set of channels where the set of orthogonal channels has varying depths;
   wherein the first cooling interface mates with the second cooling interface and the set of base slots aligns with the set of adapter slots to form a cooling fluid passageway between the cooling manifold and the at least one metal adapter.

19. The cold plate assembly of claim 1 wherein the at least one set of channels further comprises a set of microchannels.

20. The cold plate assembly of claim 19 wherein the set of microchannels comprises a set of orthogonal channels and a set of parallel channels interconnected to define an interconnected set of microchannels.

21. The cold plate assembly of claim 20 wherein the set of orthogonal channels has varying depths.

22. The cold plate assembly of claim 18 wherein the set of channels further comprises an alternating set of channels where ever other channel in the alternating set of channels is fluidly coupled to a different adapter slot in the set of adapter slots.

23. The cold plate assembly of claim 18 further comprising a lip formed in the first cooling interface for receiving the at least one metal adapter.

* * * * *